(12) United States Patent
Gotkis

(10) Patent No.: US 6,328,042 B1
(45) Date of Patent: Dec. 11, 2001

(54) WAFER CLEANING MODULE AND METHOD FOR CLEANING THE SURFACE OF A SUBSTRATE

(75) Inventor: Yehiel Gotkis, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/684,473

(22) Filed: Oct. 5, 2000

(51) Int. Cl.⁷ ........................................ B08B 7/00
(52) U.S. Cl. .................. 134/1.3; 134/2; 134/3; 134/6; 134/7; 134/8; 134/13; 134/19; 134/26; 134/28; 134/30; 134/32; 134/36; 134/41; 134/42; 134/902; 451/38; 451/39; 451/60; 156/345
(58) Field of Search ................ 134/1.3, 2, 3, 6, 134/7, 8, 13, 19, 26, 28, 30, 32, 36, 41, 42, 902; 451/38, 39, 60; 156/345

(56) References Cited

U.S. PATENT DOCUMENTS

| 4,777,804 | * | 10/1988 | Bowling et al. | 62/85 |
| 5,035,826 | * | 7/1991 | Durbut et al. | 252/121 |
| 5,160,547 | * | 11/1992 | Kirschner et al. | 134/7 |
| 5,318,636 | * | 6/1994 | Szucs | 134/7 |

FOREIGN PATENT DOCUMENTS

| EP-0423761A2 | * | 4/1991 | (EP) . |
| WO-0035627 | * | 6/2000 | (WO) . |

* cited by examiner

*Primary Examiner*—Sharidan Carrillo
(74) *Attorney, Agent, or Firm*—Martine & Penilla, LLP

(57) ABSTRACT

In a method for cleaning a surface of a substrate an amount of a solution is applied on a surface of the substrate. After the solution is applied on the surface, crystallization of the solution is initiated to form a liquid-crystal mixture. Once the liquid-crystal mixture is formed, relative motion between the liquid-crystal mixture and the substrate is created to dislodge contaminants adhered to the substrate. In one alternative method, the solution is applied on a pad. In another alternative method, the substrate is place in a bath of the solution. A wafer cleaning module also is described.

13 Claims, 9 Drawing Sheets

WAFER CLEANING MODULE AND METHOD FOR CLEANING THE SURFACE OF A SUBSTRATE

BACKGROUND OF THE INVENTION

The present invention relates generally to substrate cleaning and, more particularly, to a wafer cleaning module and a method for cleaning a surface of a substrate.

As is well known to those skilled in the art, wafer preparation and cleaning operations are performed in the fabrication of semiconductor devices. One of the functions of a wafer cleaning operation is to remove contaminants such as adhered particles and adsorbed compounds, e.g., chemicals, from the surface of the wafer. For example, during a chemical mechanical planarization (CMP) operation designed to achieve global and local planarization of a wafer surface, abrasive particles in the slurry may bond to the wafer surface and chemicals in the slurry may be adsorbed over the wafer surface.

As the feature size of integrated circuits continues to decrease, it is imperative that wafer surfaces being subjected to fabrication operations be as close to 100% free of contamination as is practical. In one known cleaning operation, wafers are scrubbed with brushes in one or more brush scrubbing stations to remove contaminants from the wafer surface. During brush scrubbing, local jets created by the mechanical movements of the brushes produce sufficient shear forces to dislodge a high percentage of contaminants from the wafer surface. In some instances, the brush scrubbing operation is supplemented by megasonic agitation, which shakes the wafer surface and thereby assists in the breaking of the intermolecular bonding between contaminants and the wafer surface. In other instances, chemicals such as KOH and $NH_4OH$ are introduced at the cleaning interface to enhance the cleaning process. When such chemicals are used, the distortion forces created by ions of the same electrical charge help overcome the intermolecular bonding between contaminants and the wafer surface.

The cleaning operations discussed above suffer from a number of shortcomings. First and foremost, these cleaning operations do not produce a contamination-free wafer because they do not remove about the last 1% of contaminants, which are bonded to the wafer surface with extremely strong intermolecular forces. Second, conventional brush scrubbing operations are coordinate centric. In other words, conventional brush stations do not scrub the center of wafers and the edges of wafers uniformly. Accordingly, multiple cleaning operations may be required to clean the entire surface of the wafer thoroughly. This is undesirable because it increases the overall time expended on wafer cleaning and thereby reduces throughput. Third, the brushes may cause micro-scratches on the wafer surface and thereby damage the wafer to such an extent that it must be discarded as scrap. This disadvantageously lowers the yield of the fabrication process. Fourth, the brushes may recontaminate the wafer surface by introducing residues of previously cleaned substrates to such a degree that multiple cleaning operations are required.

In view of the foregoing, there is a need for a method for cleaning a surface of a semiconductor wafer that provides contamination-free wafers without reducing throughput and without scratching or otherwise damaging the surface of the wafer.

SUMMARY OF THE INVENTION

Broadly speaking, the present invention fills these needs by providing methods for cleaning a surface of a substrate by agitating a liquid-crystal mixture of a saturated solution. The present invention also provides a wafer cleaning module.

In accordance with one aspect of the present invention, a first method for cleaning a surface of a substrate is provided. In this method, an amount of a solution is supplied on a surface of a substrate. Next, crystallization of the solution is initiated to form a liquid-crystal mixture. Once the liquid-crystal mixture is formed, relative motion between the liquid-crystal mixture and the substrate is created to dislodge contaminants adhered to the substrate. The method is particularly useful in the cleaning of semiconductor wafers.

In one embodiment, the operation of initiating crystallization of the solution includes heating the solution. By way of example, the solution may be heated with infrared radiation or may be heated by applying heated gas to the solution.

In one embodiment, the operation of creating relative motion between the liquid-crystal mixture and the substrate includes rotating the substrate. Alternatively, the relative motion may be created by agitating the liquid-crystal mixture with a brush.

In accordance with another aspect of the present invention, a second method for cleaning a surface of a substrate is provided. In this method, a solution is applied on a pad. Crystallization of the solution is then initiated to form a liquid-crystal mixture on the pad. Thereafter, the method continues by contacting a surface of the substrate with the pad. In one embodiment, the pad is selected from the group consisting of a belt-type pad, a rotary pad, and an orbital-type pad.

In accordance with yet another aspect of the present invention, a third method for cleaning a surface of a substrate is provided. In this method, a bath of solution is provided. Thereafter, a substrate is placed in the bath of solution. Crystallization of the solution is then initiated to form a liquid-crystal mixture. Once the liquid-crystal mixture is formed, relative motion between the liquid-crystal mixture and the substrate is created.

In one embodiment, the operation of initiating crystallization of the solution includes adjusting a temperature of the solution to a temperature at which crystallization occurs. In one embodiment, the operation of creating relative motion between the liquid-crystal mixture and the substrate includes either rotating the substrate or subjecting the liquid-crystal mixture to megasonic agitation.

In accordance with still another aspect of the present invention, a wafer cleaning module is provided. The wafer cleaning module includes a belt-type pad and a dispenser for dispensing a saturated solution. The wafer cleaning module further includes a carrier head for carrying a semiconductor wafer. Also included in the wafer cleaning module is a crystallization inducer for inducing crystallization of the saturated solution. The dispenser, the carrier head, and the crystallization inducer are disposed above the belt-type pad such that the crystallization inducer is situated between the dispenser and the carrier head. In one embodiment, the crystallization inducer is an infrared lamp.

The wafer cleaning module and the methods for cleaning surfaces of substrates of the present invention are advantageous as they have the capability of yielding a contamination-free substrate by removing the last 1% of contaminants adhered to substrate surfaces by extremely strong intermolecular bonding. More particularly, the crystal bath cleaning method of the present invention is beneficial because it has the ability to clean a substrate having a heterogeneous surface without introducing cross-contamination or micro-scratches onto the substrate surface.

Additional advantages of the wafer cleaning module and the methods for cleaning surface of substrates of the present invention are that they are flexible, are not coordinate centric, and do not reduce throughput because they do not create a bottleneck in the overall cleaning process.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

Figure 1:
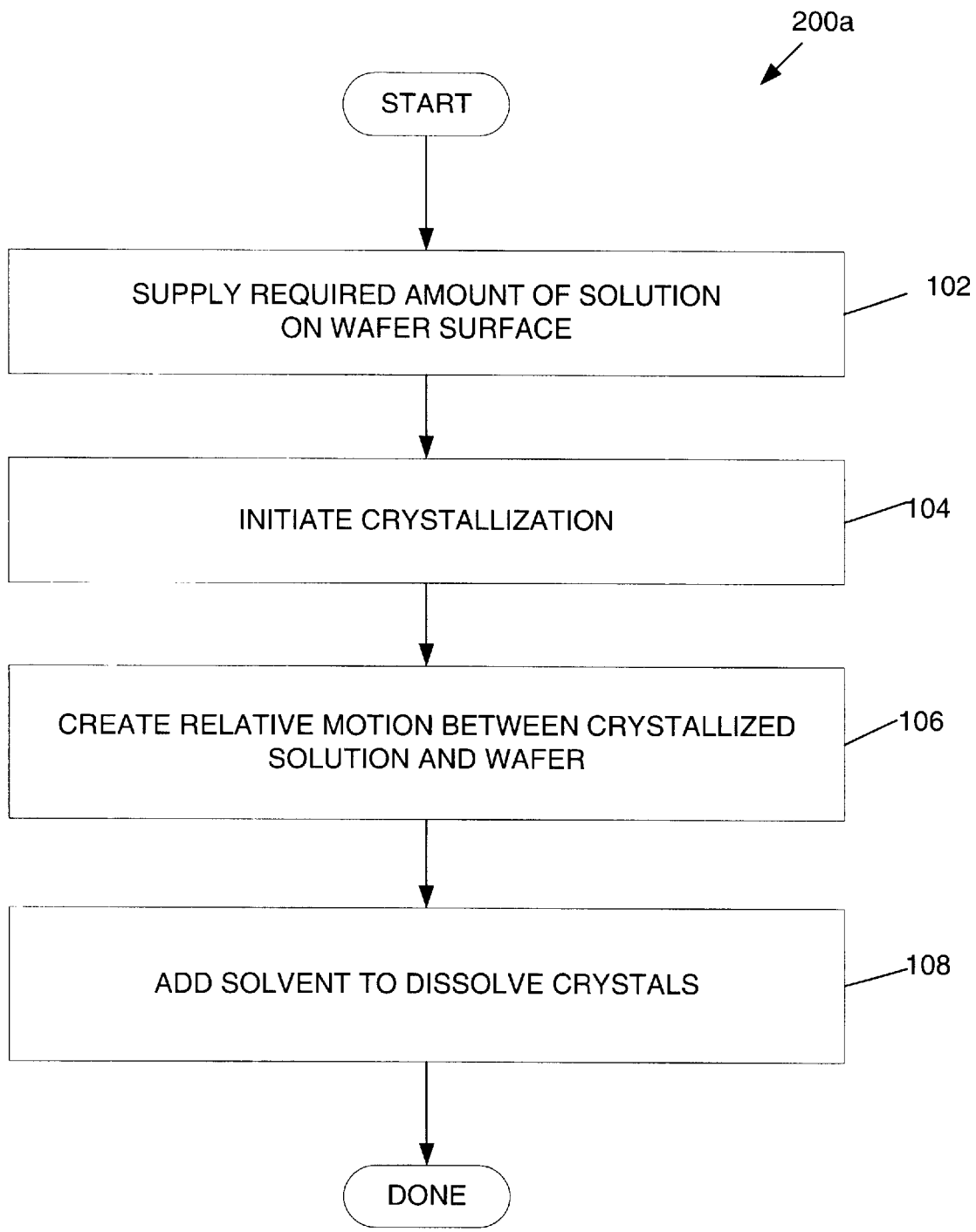
FIG. 1 illustrates a flowchart diagram depicting the method operations performed in cleaning a surface of a semiconductor wafer in accordance with one embodiment of the present invention.

FIG. 1 is a flowchart diagram 200a illustrating the method operations performed in cleaning a surface of a semiconductor wafer in accordance with one embodiment of the present invention. The method begins in operation 102 in which a required amount of a saturated solution is supplied on the wafer surface. To obtain a saturated solution, a solid component may be dissolved in a liquid component. The liquid component may be any suitable liquid such as, for example, deionized (DI) water or water-alcohol mixtures. The solid component may be any suitable soluble solid compound. Thus, those skilled in the art will appreciate that a broad range of saturated solutions may be used in the method of the present invention.

The liquid and solid components used to form the saturated solution may be selected based on the properties of the species of the contaminants to be cleaned in a particular cleaning operation. By way of example, depending on the species of the contaminants to be cleaned, the use of any of the following compounds may be appropriate: ammonium salts, e.g., ammonium fluoride, ammonium nitrate, ammonium carbonate, ammonium bicarbonate, etc.; organic acids, e.g., oxalic acid, tartaric acid, maleic acid, citric acid, benzoic acid, boric acid, EDTA, etc.; amino acids, e.g., glycine, alanine, etc.; bases, e.g., potassium hydroxide, potassium carbonate, potassium bicarbonate, etc.; solid chelating/oxidizing/reducing salts, e.g., potassium biphthalate, potassium dichromate, potassium ferricyanide, potassium ferrocyanide, potassium nitrate, potassium oxalate, potassium permanganate, etc.; solid surfactants; and ion exchange resins. For instance, for cleaning copper contaminants, it might be preferable to utilize an acidic compound such as any of the organic acids. More details with respect to the cleaning of copper contaminants will be provided below.

The concentration of the implemented saturated solution is determined by the solubility of the solid component and the solution temperature. Furthermore, the concentration of the saturated solution is determined such that the time required for the liquid component of the saturated solution to evaporate does not significantly increase the overall cleaning process.

The amount of the solution that is required is an amount sufficient to substantially coat the wafer surface contaminants, or to create a layer of the saturated solution substantially as thick as the contaminants. For instance, the size of the defects (i.e., contaminants) to be removed normally is a few microns or smaller. Thus, the required amount of the saturated solution varies depending on the size of the substrate being cleaned as well as the size of the contaminants. For example, the required minimal amount of the saturated solution per wafer could be roughly estimated to be about 1 milliliter assuming a 100 micron layer of the saturated solution covering a 300-millimeter wafer.

Still referring to operation 102, the wafer surface is then coated by the required amount of the saturated solution. This objective can be achieved utilizing different techniques. For instance, the saturated solution may be sprayed over the wafer surface until the saturated solution substantially covers the entire wafer surface. Another option would be to spin the wafer until the required amount of the solution has substantially coated the wafer surface. A third option would be to form a layer of the saturated solution by dipping the wafer surface into a container having a supply of the saturated solution. Dipping the wafer surface is cheaper and thus advantageous, as it uses only enough of the saturated solution to substantially provide a layer on the wafer surface.

Once the required amount of the saturated solution is supplied onto the wafer surface, the method then proceeds to operation 104, wherein crystallization of the saturated solution is initiated. Depending on the compound used, the crystallization operation may be achieved through either drying of the saturated solution through thermal drying or freezing of the saturated solution. Thermal drying of the saturated solution may be enhanced by the simultaneous use of gas flow (e.g., nitrogen and argon) at room or an elevated temperature. The saturated solution can further be dried through irradiating the surface with infrared (IR) radiation (e.g., infrared lamp). However, some chemical compounds cannot be heated for safety or other reasons. In such situations, the crystals may be created by freezing or cooling down the saturated solutions. As is well known, the solubility of compounds decreases at lower temperatures. Initially, as the saturated solution is being heated or cooled, crystals start forming while some liquid still remains, thus creating a liquid-crystal mixture. However, as crystallization of the saturated solution continues, almost the entire saturated solution is ultimately transformed into crystals thus creating a crystal film.

With continuing reference to FIG. 1, once crystallization is initiated, the method then continues on to operation 106, wherein relative motion is created between the crystallized saturated solution and the wafer. By way of example, this may be accomplished by rotating the wafer. However, it must be appreciated by those skilled in the art that other mechanisms may be implemented to create the relative motion between the crystallized solution and the wafer, e.g., by agitation of the remaining saturated solution utilizing a brush.

As described below, the contaminants adhered to the substrate are dislodged by the action of mechanical and chemical forces. When the wafer is rotated, the surface-contacting objects, i.e., the crystals and the remaining saturated solution, attack the contaminants on the wafer surface. At this point, the wafer surface is being mechanically and chemically bombarded by both the crystals and liquid-crystal mixture. This is caused by substantially slower movements of the liquid-crystal mixture and crystals with respect to the moving wafer, as the liquid saturated solution and crystals are not anchored to the wafer surface. Subsequently, the chemical bombardment of the contaminants escalates as the concentration of the saturated solution rises due to an increase in liquid evaporation. Lastly, full crystallization occurs. While the liquid evaporates, the chemical concentration of the saturated solution escalates until the saturated solution has completely transformed into crystal film having crystal hydrates as its main components. Thus, at the outset, the volumes of the saturated solution molecules increase significantly as the saturated solution molecules are transformed into the crystal hydrates. However, subsequently, as heat has been continuously applied to the crystal film, the existing liquid molecules contained within the crystal hydrates evaporate, thus reducing the volume of the crystals. Consequently, the crystal film cracks, thereby generating a great deal of energy. This released energy is then transferred to the adhesion interface of the contaminants and the wafer surface, creating a significant amount of shear forces. Ultimately, the shear forces facilitate the breaking of the bonding between the contaminants and the wafer surface.

Following operation 106, in operation 108, a solvent is added to the crystals so as to dissolve the crystals and to remove the entrapped contaminants from the wafer surface and the method is done. Thereafter, if desired, the wafer may be spun so as to remove the dissolved solution. Of course, to achieve a substantially contamination-free wafer surface, this method may be repeated as many times as necessary. Subsequent to the crystallization cleaning of the present invention, a final rinse and dry operation may be performed in order to rinse out and dry the treated wafer surface.

In one embodiment, the cleaning method of the present invention may be utilized in cleaning a post CMP wafer. Thus, it is preferable that the period of time required for the overall substrate cleaning methods of the present invention does not create a bottleneck for the CMP operation. As such, the period of time required for the saturated solution to crystallize is preferably no longer than approximately about 30 seconds. Similarly, the period of time required for the crystals to dissolve is preferably no longer than approximately about 30 seconds.

Figure 2:
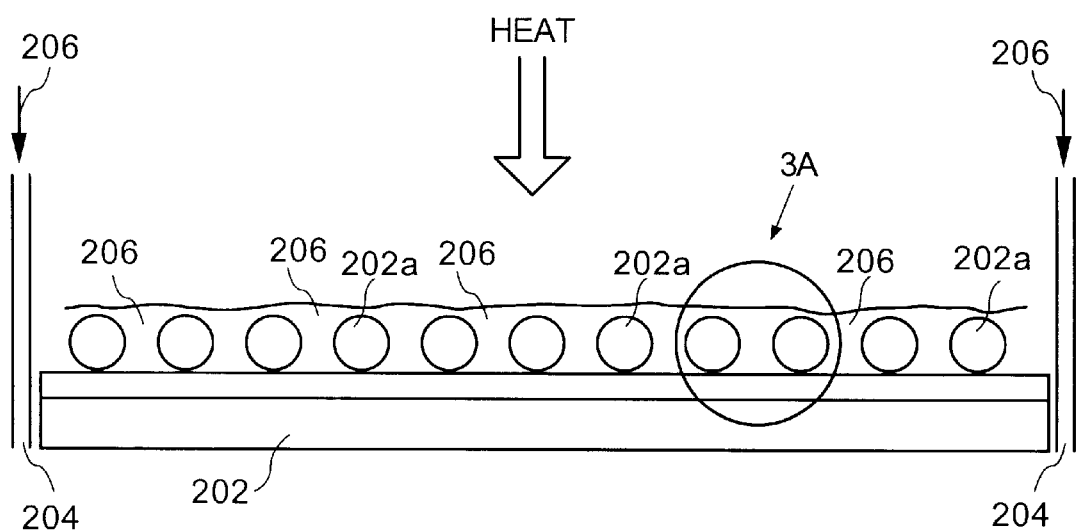
FIG. 2 is a schematic cross-sectional view of a cleaning module illustrating the supplying of a saturated solution on a wafer surface in accordance with one embodiment of the present invention.

FIG. 2 is a schematic cross-sectional view of cleaning module 200 illustrating the supplying of a saturated solution on a wafer surface in accordance with one embodiment of the present invention. As shown, supply of saturated solution 206 is directed to a surface of wafer 202 through a plurality of guiding channels 204 defined around a circumference of wafer 202. As shown, a plurality of adhered particles 202*a* present on wafer surface 202 have been coated with a layer of saturated solution 206. In one embodiment, a thickness of saturated solution layer 206 is substantially equivalent to a thickness of adhered particles 202*a* present. However, it will be apparent to those skilled in the art that in a different embodiment, the thickness of the layer of saturated solution 206 may vary depending on the application. In the embodiment of FIG. 2, crystallization of saturated solution 206 is achieved by implementing heat, e.g., IR radiation. However, it must be understood by those skilled in the art that the crystallization of saturated solution 206 can be achieved utilizing any of the appropriate mechanisms, as fully discussed above. Furthermore, in a different embodiment, saturated solution 206 may be cooled down so as to reach a crystallization phase.

Figure 3A:
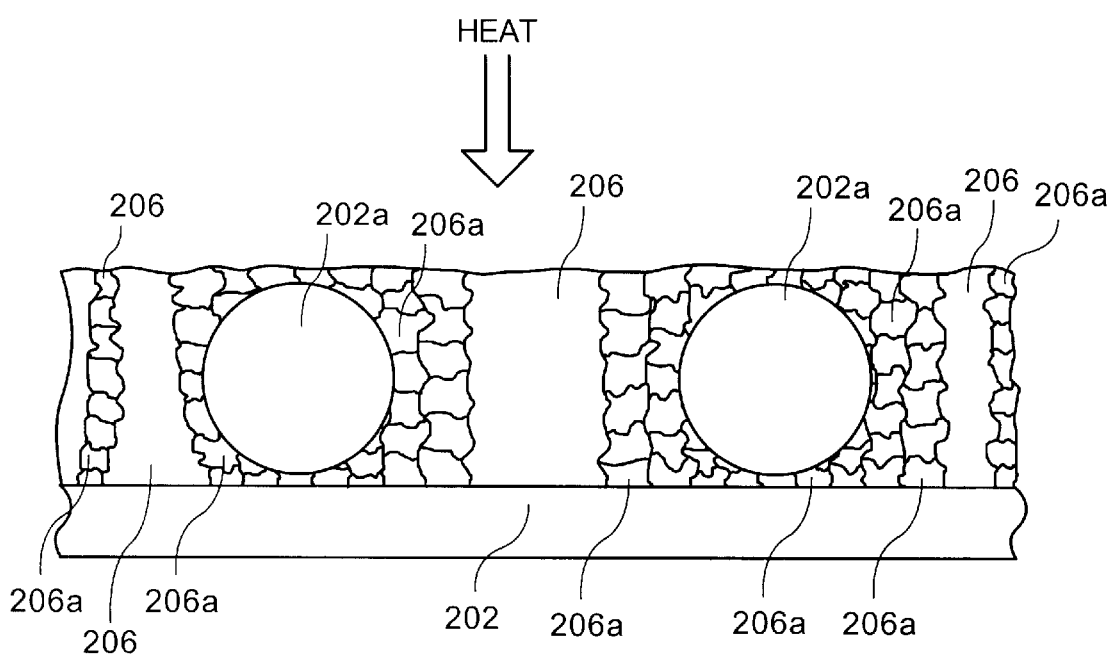
FIG. 3A is an enlarged, cross-sectional, partial view of the wafer depicted in FIG. 2 illustrating the coating of the wafer surface with a layer of a liquid-crystal.

FIG. 3A is an enlarged, cross-sectional, partial view of wafer 202 shown in FIG. 2 illustrating the coating of wafer surface 202 with a layer of liquid-crystal mixture in accordance with one embodiment of the present invention. As shown, crystals 206*a* of saturated solution 206 have substantially entrapped adhered particles 202*a*. This occurs because normally, adhered particles 202*a* substantially act as crystallization centers and as such, initiate the crystallization process. Thus, initially, as heat is applied to saturated solution 206, crystals 206*a* are gradually formed around adhered particles 206*a* while some liquid still remains. At this point, if the liquid-crystal mixture of saturated solution 206 is actuated by e.g., spinning wafer or introducing brushes, crystals 206*a* and liquid saturated solution 206 mechanically bombard adhered particles 202*a* thus dislodging them. However, as more heat is applied to the liquid-crystal mixture, the concentration of saturated solution 206 rises, therefore increasing the chemical bombardment of adhered particles 202*a* by saturated solution 206.

Figure 3B:
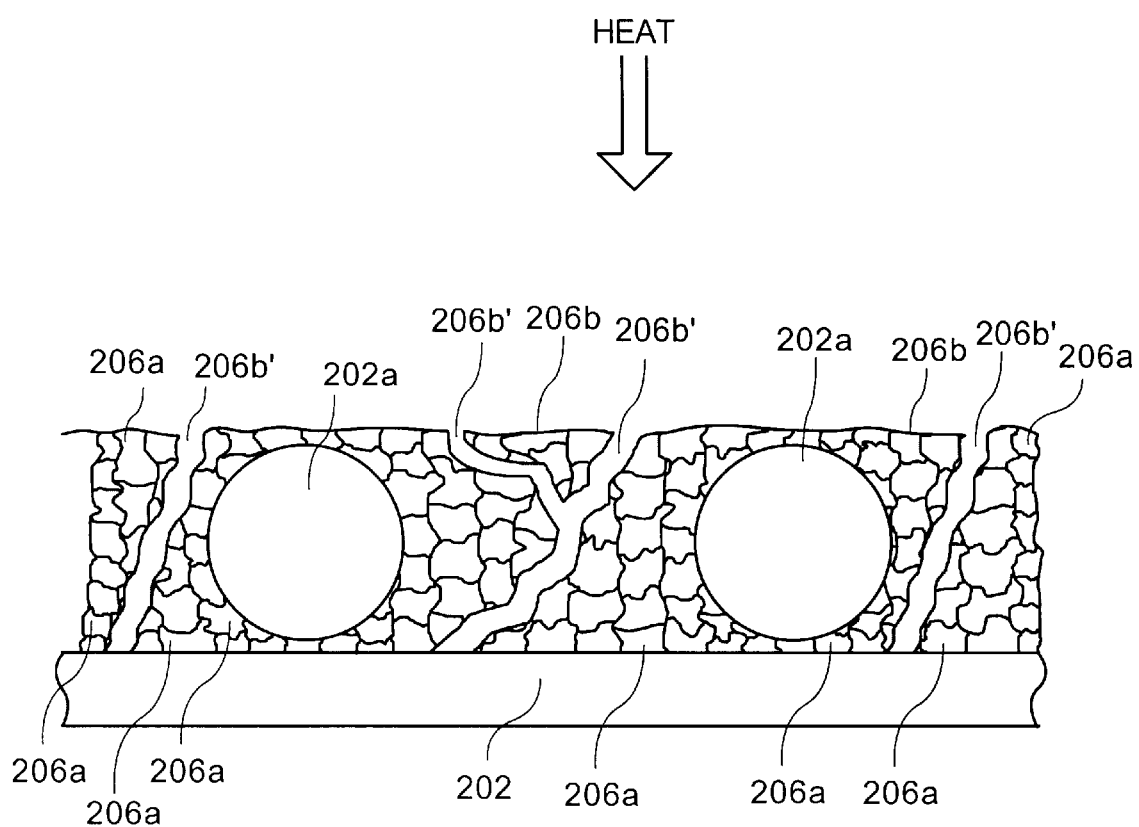
FIG. 3B is an enlarged, cross-sectional, partial view of the wafer depicted in FIG. 2 illustrating the cracking of a crystal film formed upon evaporation of the liquid in the liquid-crystal mixture.

FIG. 3B is an enlarged, cross-sectional, partial view of wafer 202 in FIG. 2 illustrating a cracking of a crystal film in accordance with one embodiment of the present invention. As shown, heat has been applied to saturated solution 206 thus substantially transforming it to crystal film 206*b* having the crystal hydrates as its main components. As shown, adhered particles 202*a* have substantially acted as the crystallization centers and have been surrounded and entrapped by crystals 206*a*. As heat application has been continuous, the water molecules of crystal hydrates 206*a* have evaporated decreasing the volumes of crystals 206*a*, thus creating cracks 206*b* ' in crystal film 206*b*. Energy created as a result of the cracking of the crystal film 206b has been transferred into the adhesion interface between adhered particles 202a and wafer surface 202 creating a significant amount of shear forces. The created shear forces have assisted in the breaking of the intermolecular bonding between adhered particles 202a and wafer surface 202.

The present invention as set forth above, is particularly beneficial in cleaning wafers having heterogeneous surfaces, wafer surfaces with topography, and specifically, in postcopper-CMP cleaning. As is well known, a set of unique challenges is faced in patterned copper wafer cleaning. For instance, in addition to cleaning the contaminants, a copper cleaning method must further have the capability to remove copper by-products remained on the wafer surface and wafer backside. In addition, the implemented cleaning method is required to prevent any copper corrosion and eliminate wafer-to-wafer cross contamination. The present invention meets these needs as it substantially removes the contaminants and copper by-products from the wafer surfaces while eliminating the possibility of copper corrosion and wafer surface cross-contamination.

For instance, in one embodiment, utilizing the substrate cleaning method of FIG. 1, copper cleaning of a wafer initially begins by supplying a required amount of a saturated solution on a wafer surface. Preferably, in copper cleaning, an acidic compound, e.g., oxalic acid ($H_2C_2O_4$), tartaric acid, maleic acid, citric acid, benzoic acid, boric acid, EDTA, or any other organic acid, may be used to make the saturated solution. Furthermore, oxidizers or inhibitors, e.g., benzotriazole, may also be added to provide an inhibiting action. Then, utilizing an infrared light, crystallization of the saturated solution is initiated. As is well known, visible light causes copper corrosion and thus cannot be used in copper cleaning. Furthermore, infrared radiation generates a more intense heat thus reducing drying time. In copper cleaning, adhered particles, i.e., contaminants, such as slurry particulates and chemicals and copper by-products, act as crystallization centers and are thus entrapped by crystal hydrates. As a relative motion is created between the liquid-crystal mixture of the saturated solution and the wafer, for example, by spinning the wafer, the crystals and the liquid components of the liquid-crystal mixture attack the adhered particles chemically and mechanically thus dislodging the adhered particles. Then, a solvent is added to the wafer surface in order to dissolve the entrapped adhered particles and saturated solution crystals without introducing any micro-scratches on the wafer surface.

The use of crystals to dislodge the contaminants from the wafer surface as set forth herein is advantageous because it is not coordinate centric. In contrast, conventional brush scrubbing operations are coordinate sensitive and fail to uniformly brush scrub both the edges of the wafers and the center of the wafers. In addition, the use of crystals in a liquid-crystal mixture to dislodge contaminants provides the capability to clean the last 1% of the contaminants remaining on the substrate surface, including contaminants that are disposed in small recessed topography features of the wafer surface.

Figure 4:
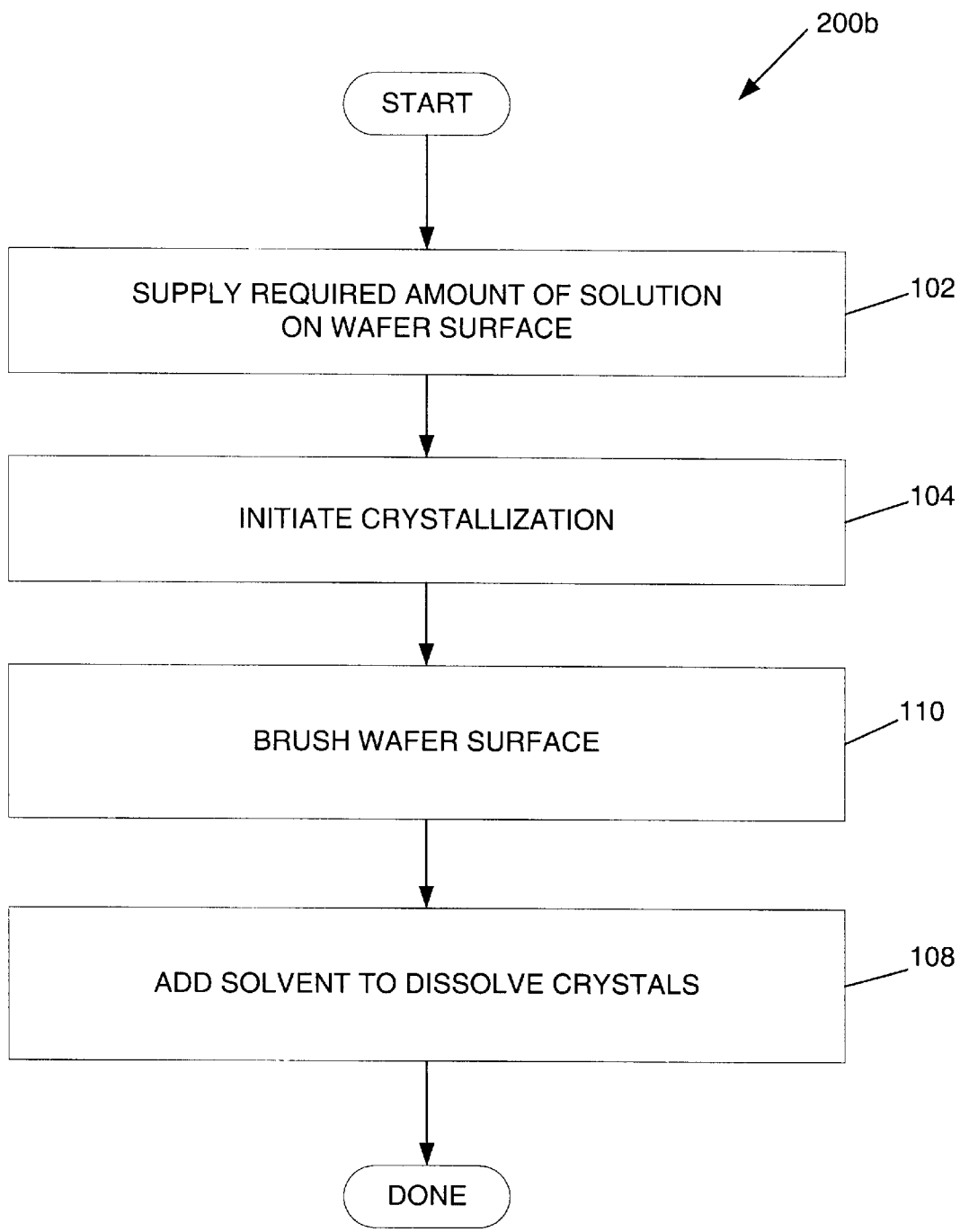
FIG. 4 is a flowchart diagram illustrating the method operations performed in cleaning a semiconductor wafer using a brush in accordance with another embodiment of the present invention.

FIG. 4 is a flowchart diagram 200b illustrating a method operations performed in cleaning a semiconductor wafer using a brush in accordance with one embodiment of the present invention. The method begins in operation 102 in which a required amount of a saturated solution is supplied on a wafer surface. Next, the method moves to operation 104, wherein the crystallization of the supplied saturated solution is initiated. Operations 102 and 104 have been fully discussed above with reference to FIG. 1.

The method then continues to operation 110, wherein the wafer surface having a liquid-crystal mixture is brushed. In one embodiment, the brush may be a polyvinyl alcohol (PVA) pancake style brush. In this embodiment, the chemical attack of the liquid-crystal mixture on the contaminants is supplemented by the mechanical movements of the pancake brush, thereby enhancing the dislodging of the contaminants from the wafer surface. Subsequently, in operation 108, the dislodged contaminants and liquid-crystal mixture are dissolved utilizing a solvent and the method is done.

Although the embodiment described above utilizes a pancake style brush, it must be appreciated by those skilled in the art that any appropriate brush style, e.g., pencil brushes or rotary brushes also may be used. Furthermore, besides being made out of PVA foam, the implemented brush may be made of any appropriate material, e.g., nylon or mohair.

Figure 5A:
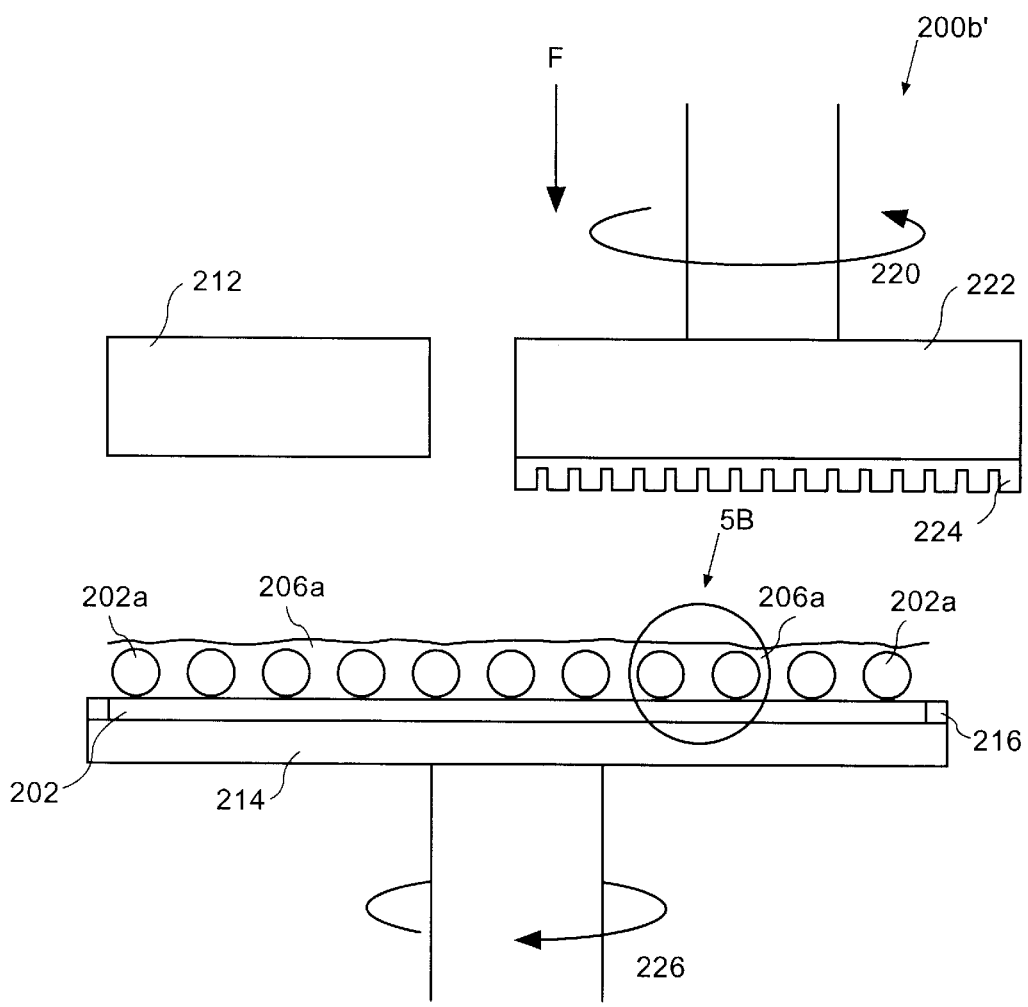
FIG. 5A is a schematic cross-sectional view of a cleaning module illustrating the cleaning of particles adhered to the wafer surface using a pancake brush in accordance with yet another embodiment of the present invention.

The method of FIG. 4 can further be understood in view of cleaning module 200b' shown in FIG. 5A illustrating the cleaning of wafer surface adhered particles using a pancake brush in accordance with one embodiment of the present invention. As shown in FIG. 5A, carrier head 214 is configured to rotate in a rotation direction 226 while engaging wafer 202 utilizing retaining ring 216. In one embodiment, adhered particles 202a are coated with a layer of saturated solution 206. As shown, in one embodiment, brush 224 mounted on plate 222 is positioned substantially above and to the left of carrier head 214 and is configured to be applied to wafer surface 202 with force F, while it rotates in brush rotation direction 220. Crystallization inducer 212 is positioned substantially above and to the left of carrier head 214. In one embodiment, crystallization inducer 212 is a heating module, e.g., a lamp. As shown, the radiation generated by crystallization inducer 212, e.g., lamp is substantially aimed onto wafer surface 202.

Figure 5B:
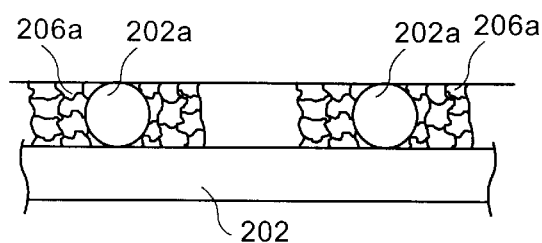
FIG. 5B is an exploded, partial, cross-sectional view of the wafer depicted in FIG. 5A illustrating the entrapment of the adhered particles with the freshly formed crystals.

FIG. 5B is an exploded, partial, cross-sectional view of wafer 202 shown in FIG. 5A illustrating the trapping of adhered particles 202a with freshly formed crystals 206a of saturated solution 206. The wafer cleaning module 200b' of FIG. 5A employs a combination of chemical and mechanical forces to dislodge adhered particles 202a from wafer surface 202. Initially, as wafer 202 rotates in rotation direction 226, crystals 206a of liquid-crystal mixture 206 chemically and mechanically bombard adhered particles 202a. This mechanical bombardments are the result of the collusion of slow moving unanchored crystals 206a with particles 202a thus dislodging adhered particles 202a. Whereas, the chemical attacks are the result of the evaporation of liquid present in saturated solution 206. This chemical and mechanical bombardment is further complemented by the mechanical movements of pancake brush 224. As carrier head 214 and thus wafer 202 and liquid-crystal mixture rotate in rotation direction 226, rotating brush 224 is applied onto rotating wafer 202, thereby dislodging adhered particles 202a.

Figure 6:
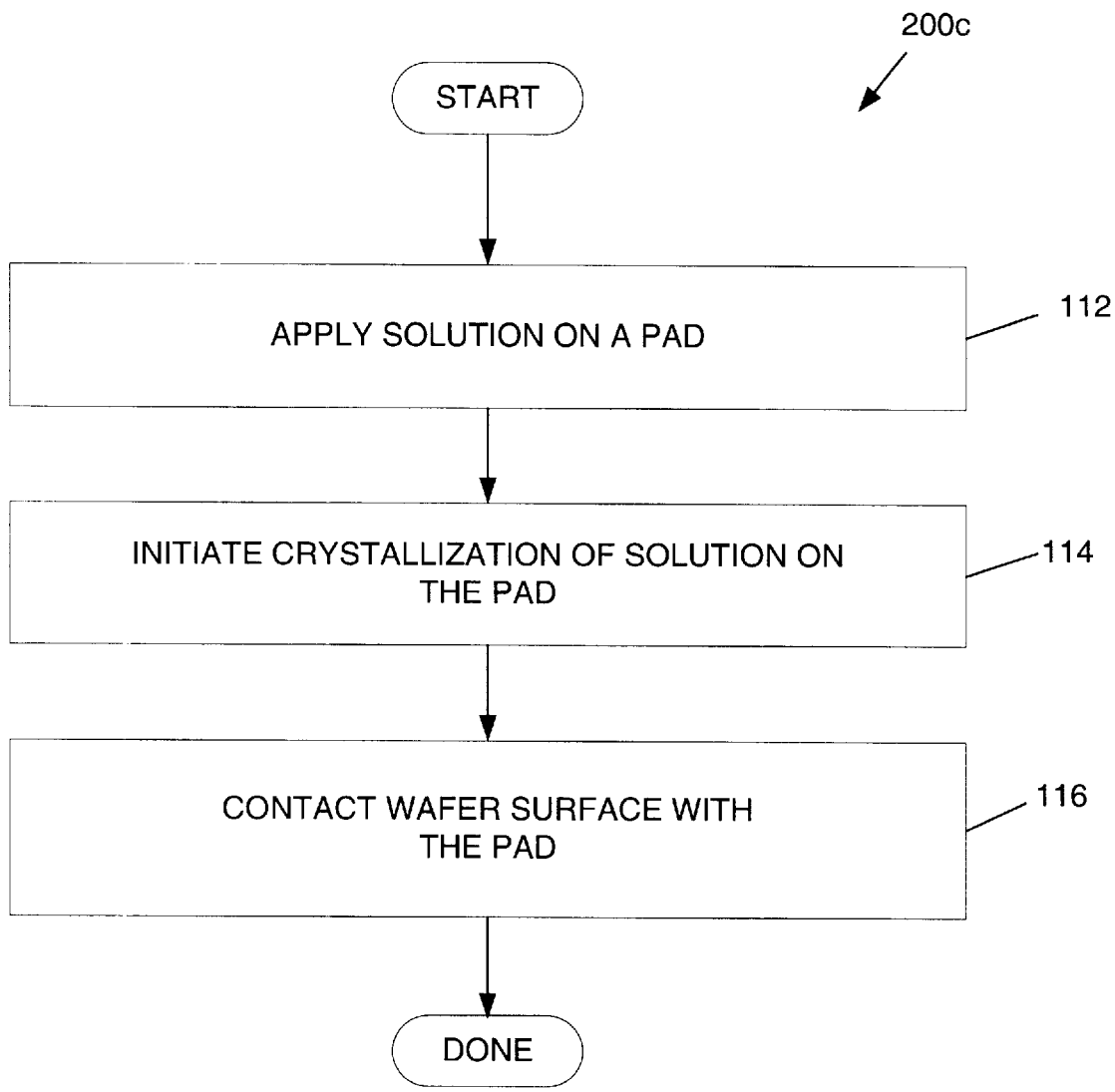
FIG. 6 is a flowchart of the method operations performed in cleaning a semiconductor wafer surface using a pad in accordance with yet another embodiment of the present invention.

FIG. 6 is a flowchart 200c of the method operations performed in cleaning a semiconductor wafer surface using a pad in accordance with another embodiment of the present invention. The method begins in operation 112, wherein a saturated solution is supplied on a pad. In one embodiment, the pad is a soft pad; however, it must be understood by those skilled in the art that any other appropriate type of pad also may be used. In one embodiment, the amount of the saturated solution to be supplied on the pad is configured to be substantially enough to form a layer of the saturated solution on the entire pad surface. This objective can be achieved by supplying the saturated solution onto the pad surface utilizing different methods, e.g., a guiding channel or spraying the pad directly with saturated solution. Thereafter, the method continues to operation 114, wherein crystallization of the supplied saturated solution is initiated. The details regarding the solution and the crystallization of the solution to form a liquid-crystal mixture described above in connection with operations 102 and 104 (see FIG. 4) also apply to operations 112 and 114, respectively.

Once the crystals start appearing on the pad surface, the method then moves on to operation 116, wherein the wafer surface comes into contact with the pad. In this method, the chemical attack of the liquid-crystal mixture on the contaminants begins when the crystals of the liquid-crystal mixture surround and entrap the contaminants as the liquid-crystal mixture comes into contact with the contaminants. Thereafter, this chemical attack is supplemented by the mechanical movements of the pad, ultimately, dislodging the contaminants. At this point, the method is done.

Figure 7A:
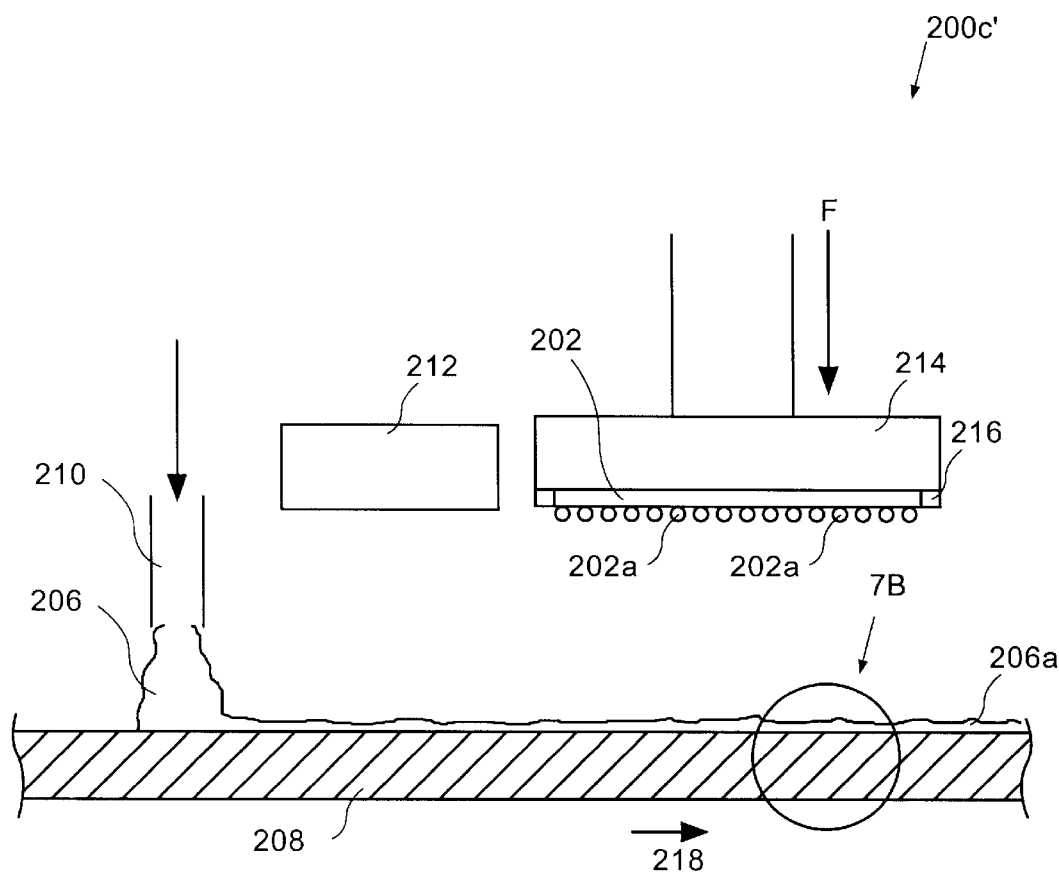
FIG. 7A is a simplified, partial, cross-sectional view of a cleaning module illustrating the cleaning of the adhered particles utilizing a belt-type pad having a layer of liquid-crystal mixture in accordance with a still further embodiment of the present invention.

The method of FIG. 6 can further be understood in view of FIG. 7A. FIG. 7A is a simplified, partial, cross-sectional view of wafer cleaning module 200c' illustrating the cleaning of adhered particles utilizing a belt-type pad having a layer of liquid-crystal mixture in accordance with one embodiment of present invention. As shown, in one embodiment, saturated solution 206 is configured to be transferred onto a surface of belt-type pad 208 through saturated solution dispenser 210 positioned substantially above and to the left of pad 208. Carrier head 214 engaging wafer 202 utilizing retaining ring 216 is positioned substantially above and to the right of pad 208. Carrier head is configured to apply wafer 202 onto moving pad 208 utilizing force F. A crystallization inducer 212 is disposed substantially above pad 208 and between saturated solution dispenser 210 and carrier head 214. In one embodiment, crystallization inducer 212 is a heating module, e.g., a lamp. As such, heat generated from crystallization inducer 212 is directed to saturated solution 206 evaporating liquid present in saturated solution 206, thus creating a liquid-crystal mixture. As pad 208 moves in movement direction 218, the liquid-crystal mixture comes into contact with adhered particles 202a of wafer surface 202, thereby dislodging adhered particles 202a.

Figure 7B:
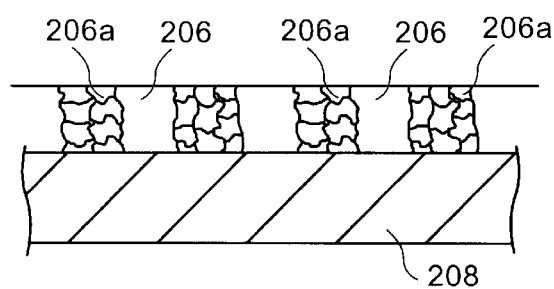
FIG. 7B is an exploded, partial, cross-sectional view of the pad shown in FIG. 7A, revealing the co-existence of the crystals and the saturated solution on the pad surface.

FIG. 7B depicts an exploded, partial, cross-sectional view of pad 208 shown in FIG. 7A, revealing the co-existence of crystals 206a and saturated solution 206 on pad 208 in accordance with one embodiment of the present invention. Although in this embodiment pad 208 is a belt-type pad, it must be understood by those skilled in the art that pad 208 may be any appropriate shape, e.g., rotary or orbital-type.

Figure 8:
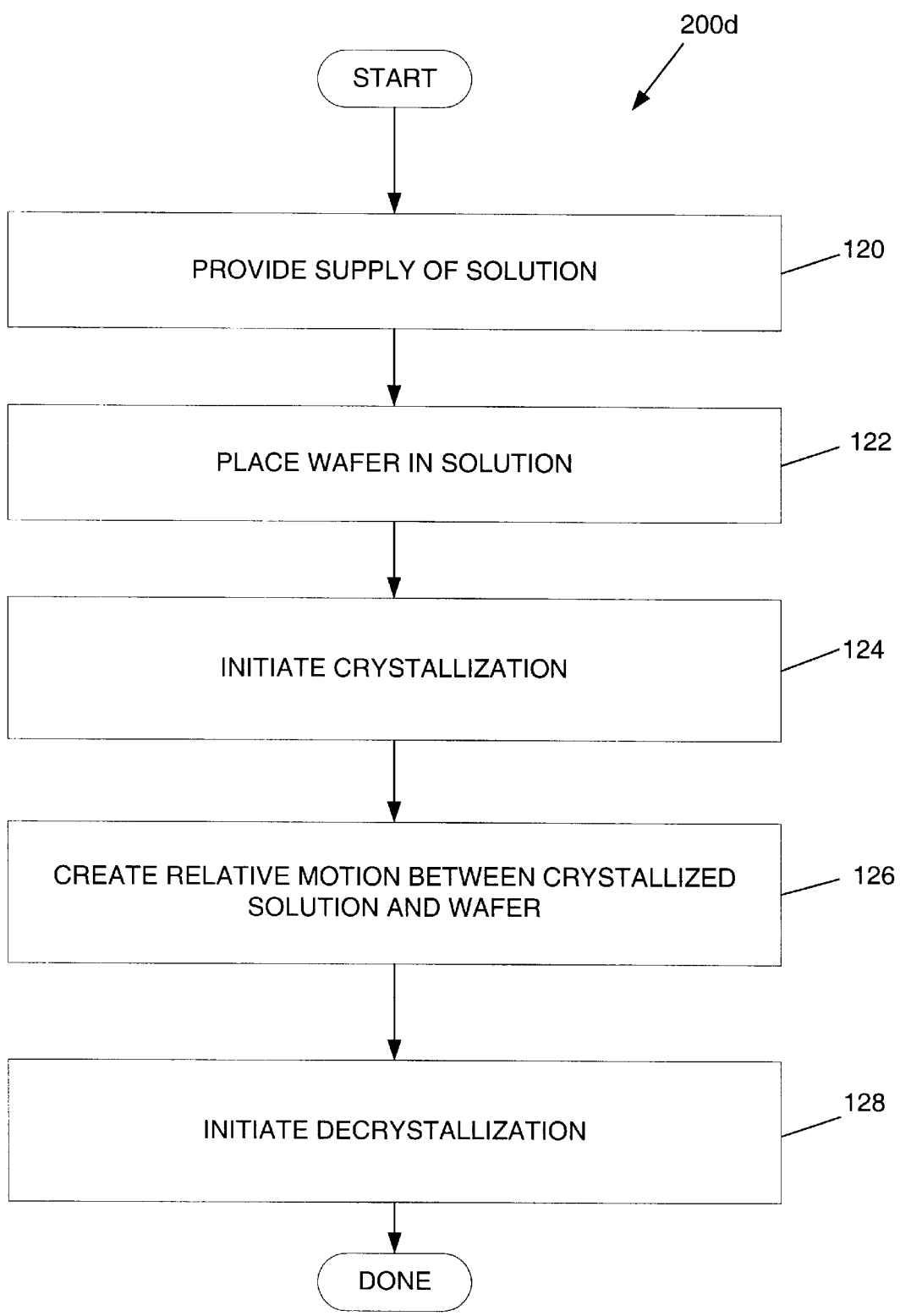
FIG. 8 is a flowchart diagram illustrating the method operations performed in cleaning a surface of a semiconductor wafer utilizing a crystal bath in accordance with another embodiment of the present invention.

FIG. 8 is a flowchart diagram 200d illustrating the method operations performed in cleaning a surface of a semiconductor wafer utilizing a crystal bath in accordance with one embodiment of the present invention. The method begins in operation 120 in which a supply of a solution is provided. The supply of the solution, which may be a saturated solution, is preferably placed in a container and is enough to cover a semiconductor wafer placed inside the container. More details with respect to the solid component and liquid component to be utilized in the making of the saturated solution have been provided above with respect to operation 102 (see FIG. 1).

Thereafter, in operation 122 the wafer is placed in the saturated solution.

Continuing to operation 124, the method then initiates the crystallization of the saturated solution. The details regarding the crystallization operation described above in connection with operation 104 (see FIG. 1) also apply to operation 124. In one embodiment, depending on the solid component and liquid component implemented, the crystallization of the saturated solution is achieved by lowering a temperature of the saturated solution below a crystallization temperature $T_C$. Once the temperature of the saturated solution is lower than $T_C$, the saturated solution starts transforming into a liquid-crystal mixture. Thereafter, the method continues to operation 118 in which a relative motion is created between the liquid-crystal mixture and the wafer. In one embodiment, the relative motion is created through rotating the wafer inside the liquid-crystal mixture bath. However, in a different embodiment, the relative motion may be created through any appropriate mechanism, e.g., megasonic agitation. As a result of creating the relative motion between the wafer and the liquid-crystal mixture, the freshly formed crystals surround and entrap the contaminants remained on the wafer surface. Consequently, the entrapped contaminants may be dislodged as a result of the jets created by the movement of the wafer, or the agitated liquid-crystal mixture through megasonic agitation. Finally, as the method continues to operation 120, the liquid-crystal mixture is de-crystallized by e.g., increasing the temperature of the liquid-crystal mixture to above the $T_C$. As the temperature of liquid-crystal mixture increases, the crystals start transforming back into the liquid state of the saturated solution thus releasing the dislodged contaminants into the saturated solution bath.

As the crystal bath cleaning method does not utilize a brush in cleaning the wafer surface, it is very flexible and thus advantageous. It is specifically beneficial in cleaning of wafers having heterogeneous surfaces, e.g., copper wafers, as wafer cleaning can be accomplished in multiple repeated cleaning operations. In such situations, the wafer is placed in the container filled with the saturated solution suitable for cleaning a first type of contaminants and by-products and cleaned. Then, the container is drained and the wafer is rinsed and dried for a subsequent wafer cleaning operation. Next, the wafer is cleaned by placing the wafer in the container filled with a saturated solution suitable for cleaning a second type of contaminants and by-products. Thereafter, the container is drained once more and the wafer is rinsed and dried for a second time. This cleaning sequence may be repeated for as many time as necessary without introducing any cross-contamination from prior cleaning operations.

It must be appreciated by one of ordinary skill in the art that although in this embodiment, the saturated solution was cooled down to reach its $T_C$, in a different embodiment, the saturated solution may be heated until a liquid-crystal mixture is attained. Furthermore, once the contaminants, acting as crystallization centers, become surrounded by the crystals, the binding forces are broken thus dislodging the particles. Thereafter, a simple dissolution and rinsing of the crystals would be good enough to remove the particles from the wafer surface in this case.

In summary, the present invention provides methods for cleaning a surface of a substrate by creating a relative motion between a liquid-crystal mixture of a solution and a substrate and a wafer cleaning module. The invention has been described herein in terms of several preferred embodiments. Other embodiments of the invention will be apparent to those skilled in the art from consideration of the specification and practice of the invention. For example, the cleaning methods may be modified to include megasonic agitation at some phases. The embodiments and preferred features described above should be considered exemplary, with the invention being defined by the appended claims.

What is claimed is:

1. A method for cleaning a surface of a substrate, comprising:

applying an amount of a liquid solution on a surface of a substrate;

initiating crystallization of the liquid solution once said liquid solution is applied to the surface of the substrate by heating said liquid solution form a liquid-crystal mixture on the surface of the substrate; and cleaning the surface of the substrate by creating relative motion between the liquid-crystal mixture and the substrate.

2. The method of claim 1, wherein the substrate is a semiconductor wafer.

3. The method of claim 1, wherein the liquid solution is a saturated solution.

4. The method of claim 1, wherein the liquid solution is heated with infrared radiation.

5. The method of claim 1, wherein the liquid solution is heated by applying heated gas to the liquid solution.

6. The method of claim 1, wherein the operation of creating relative motion between the liquid-crystal mixture and the substrate comprises rotating the substrate.

7. The method of claim 1, further comprising:

adding a solvent to dissolve crystals in the liquid-crystal mixture.

8. The method of claim 1, wherein the operation of creating relative motion between the liquid-crystal mixture and the substrate comprises agitating the liquid-crystal mixture with a brush.

9. A method for cleaning a surface of a substrate, comprising:

providing a bath of a liquid solution;

placing a substrate in the bath of the liquid solution;

initiating crystallization of the liquid solution once the substrate is placed in the bath by heating said liquid solution to form a liquid-crystal mixture in the bath; and cleaning the surface of the substrate by creating relative motion between the liquid-crystal mixture and the substrate.

10. The method of claim 9, wherein the substrate is a semiconductor wafer.

11. The method of claim 9, wherein the liquid solution is a saturated solution.

12. The method of claim 9, wherein the operation of initiating crystallization of the liquid solution comprises adjusting a temperature of the liquid solution to a temperature at which crystallization occurs.

13. The method of claim 9, wherein the operation of creating relative motion between the liquid-crystal mixture and the substrate comprises one of rotating the substrate and subjecting the liquid-crystal mixture to megasonic agitation.

* * * * *